(12) United States Patent
Dubowski

(10) Patent No.: US 6,670,644 B2
(45) Date of Patent: Dec. 30, 2003

(54) LASER-INDUCED BANDGAP SHIFTING FOR PHOTONIC DEVICE INTEGRATION

(75) Inventor: Jan J. Dubowski, Ottawa (CA)

(73) Assignee: National Research Council of Canada, Ottawa (CA)

( * ) Notice: Subject to any disclaimer, the term of this patent is extended or adjusted under 35 U.S.C. 154(b) by 0 days.

(21) Appl. No.: 10/299,663

(22) Filed: Nov. 20, 2002

(65) Prior Publication Data

US 2003/0096509 A1 May 22, 2003

Related U.S. Application Data

(62) Division of application No. 09/654,616, filed on Sep. 1, 2000, now Pat. No. 6,514,784.

(51) Int. Cl.$^7$ ................................. H01L 33/00
(52) U.S. Cl. ............................. 257/94; 257/79
(58) Field of Search ....................... 257/79, 94

Primary Examiner—Long Pham
(74) Attorney, Agent, or Firm—Marks & Clerk

(57) ABSTRACT

To shift the bandgap of a quantum well microstructure, the surface of the microstructure is selectively irradiated in a pattern with ultra violet radiation to induce alteration of a near-surface region of said microstructure. Subsequently the microstructure is annealed to induce quantum well intermixing and thereby cause a bandgap shift dependent on said ultra violet radiation.

5 Claims, 4 Drawing Sheets

Photoluminescence map of a 5QW InGaAs/InGaAsP laser structure following laser irradiation (no optical change detected).

Photoluminescence map of same sample following 10 sec RTA at 750°C.
Two laser-processed sites can clearly be seen with the blue-shifted regions to 1476 and 1449 nm.

LASER-INDUCED BANDGAP SHIFTING FOR PHOTONIC DEVICE INTEGRATION

CROSS REFERENCE TO RELATED APPLICATION

This application is a divisional application under 35 CFR 121 of U.S. patent application Ser. No. 09/654,616 filed Sep. 1, 2000 now U.S. Pat. No. 6,514,784.

FIELD OF THE INVENTION

This invention relates to photonics, and in particular to a method for selectively shifting the bandgap in quantum well microstructures.

BACKGROUND OF THE INVENTION

The rapid growth of fiber-optic based applications for communications has resulted in the proliferation of manufacturing sites capable of keeping up with the growing demand of photonic devices. The fiber-optic component market is expect to increase from $6.7 billion in 1999 to over $23 billion in 2003. In order to keep with this growth, the current manufacturing methods that depend heavily on labor extensive assembly of individual devices, have to give way to technologies capable of manufacturing integrated devices, in a manner similar to what has been taking place since 1970s in the microelectronics industry. Generally, current manufacturing technologies of photonics devices deal separately with active (lasers, amplifiers, switches) and passive (waveguides, filters, microlenses) components. This is mostly due to the incompatibility of technologies that are required for manufacturing both passive and active device materials.

Advances in fiber optics communication technology have resulted in the deployment of systems, carrying different wavelengths of light on a single fiber. The wavelength division multiplexing (WDW) technology is elegant, scalable and most effective in delivering increased bandwidth. The most crucial device of WDM is a quantum well (QW) semiconductor laser. The currently used lasers are distributed feedback (DFB) type discrete devices with thermoelectric coolers (TEC) for fine wavelength tuning and maintaining stable wavelength within different operating conditions.

There is a demand for duplicate wavelengths in communication systems with high reliability where spare channels have to be provisioned to provide backup in a case of transmitter failure. This need can be fulfilled with tunable lasers or multi wavelength lasers.

Wavelength tunability can be achieved by constructing a Bragg grating within the laser structure. The tunable lasers are usually DFB lasers with multiple segments of distributed Bragg reflectors integrated within semiconductor structure (e.g., C. Clarke et al., 'Tunable Lasers Provide Flexible Optical Routing Solutions, Laser Focus World, April 1999, p. 77).

Another approach is to provide fiber Bragg grating in an external cavity DFB, laser structure. Tuning in this case involves mechanical movement of the grating and thus is relatively slow.

An alternative solution is a hybrid array of multi-wavelength lasers built within the same package and usually equipped with an optical combiner for signal distribution. Such a hybrid consists of lasers that are selected from different wafers; based on the wavelength they emit, and usually don't exceed 16 lasers in one package.

The single laser sources for WDM systems require a bulky package. Individually enclosed lasers, usually in butterfly package, occupy significant space within system sub-assemblies.

Individual fiber pigtails demand attention during assembly and testing, and require management at subsystem levels. Discrete laser wavelengths necessitate maintaining numerous (and costly) module inventory as spare circuits/modules by network operators.

Both tunable and multi-wavelength lasers exhibit a number of limitations. These devices have a limited tuning range (typically less than 20 nm) and they are relatively expensive considering technological difficulties in large-scale fabrication.

Tunable sources are slow when switching from one wavelength to another and this may be a serious drawback for certain network architectures.

The cost of DFB lasers modules and tunable sources is still prohibitive in penetrating data networking segments such as LANs, MANs and future residential high-bandwidth access market. The cost of an individual uncooled laser and a high performance cooled laser for communication applications runs at about U$200 and U$ 1,400, respectively. A 4-wavelength laser hybrid costs in excess of U$18,000.

The paper "Semiconductor Laser Array Fabricated by Nd:YAG Laser-induced Quantum Well Intermixing", by J. J. Dubowski, G. Marshall, Y. Feng, P. J. Poole, C. Lacelle, J. E. Haysom, S. Charbonneau and M. Buchanan, SPIE vol. 3618, 191–197, describes an idea of creating a material with continuously changing bandgap that would be useful for the fabrication of multiwavelength semiconductor laser arrays. The method is based on the application of an IR laser with a beam profile shaped in such a way that a gradient of temperature would be induced on an irradiated semiconductor wafer. The principle of this method is based entirely on temperature-induced quantum well intermixing.

While this proposal offers a partial solution to the problems outlined above, it is based entirely on temperature-induced quantum well intermixing. Such approach is limited in its ability to shift the band gap with a sufficient lateral resolution (contrast) required for manufacturing of micrometer-scale integrated photonic devices. An object of the invention is to provide an improved solution to the problems occurring in the prior art.

SUMMARY OF THE INVENTION

According to the present invention, there is provided a method of selectively shifting the bandgap of a quantum well microstructure, comprising providing a microstructure containing quantum wells, irradiating a surface of said microstructure with changing ultra violet (UV) radiation to cause alteration of a near-surface region, said ultra violet radiation being varied across said surface to change the amount of said alteration, said alteration being selected from the group consisting of defect formation and chemical alteration, and subsequently annealing the microstructure to induce quantum well intermixing mediated by said alteration and thereby cause a bandgap shift dependent on said ultra violet radiation.

The microstructure may be selectively irradiated in a predetermined pattern, for example, in the form of an array, or alternatively the whole microstructure can be irradiated while changing the ultraviolet radiation, for example, radiation dose, intensity or wavelength, across the surface of the microstructure in order to provide a continually changing bandgap across the wafer in the finished device.

The invention makes use of UV photons to induce defect formation or cause chemical alteration of the near-surface region. The use of UV photons for defect formation (or changing chemical composition of the material at the surface) is very efficient since this is a direct process: no ion implantation, or impurity doping are required. Therefore, it is a much faster and potentially a much more cost-effective process than alternative methodologies.

The use of UV lasers for bandgap shifting is, in its simplest approach, a two-step process. First, the laser is used to produce defects and/or chemically altered material at the surface of a quantum well microstructure. Since the penetration of the UV radiation into the sample is strongly dependent on the laser wavelength, a precise amount of defects (composition of the surface layer) can be achieved in the near-surface region by choosing a proper laser and the irradiation dose. The UV irradiation is a highly selective laterally process, with processed areas comparable to the laser spot size (sub-micrometer resolution).

In the second step, the laser processed wafer (selectivity is used to generate required patterns) is annealed for a very short time (10–15 sec) and defect-enhanced quantum well intermixing is achieved. Annealing at his stage can be carried out in a conventional RTA (Rapid Thermal Anneal) furnace, or with an IR laser (to maintain high selectivity of the process and allow for in-situ diagnostics). Large amplitudes of the bandgap shifting (more than 100 nm) are achieved with this method.

The technology is based on the application of UV lasers for formation of surface defects and/or an "altered layer" of material at the surface of processed sample (wafer). The concentration and physical nature of the defects, as well as the chemical composition of the altered layer affect the quantum well intermixing (QWI) process that takes place during annealing of the UV processed material. The lateral resolution of the process makes it possible to fabricate micro-arrays of monolithically integrated multiwavelength lasers. For instance, for a 3 $\mu$m wide ridge structure, a laser chip consisting of an array of 100–200 lasers each laser emitting at a fixed but different wavelength, could be fabricated on a 2–3 mm long bar. The same technology can be used to fabricate waveguides integrated with each laser from the array or more complex integrated photonic microstructures.

The invention permits the fine tuning of the optical properties of wafers used for manufacturing of semiconductor lasers. The lateral selectivity of the process makes possible tuning of individual lasers from multi-wavelength laser arrays.

The invention can be applied to manufacturing technology for processing epitaxial wafers of photonic materials and fabrication of inexpensive monolithically integrated devices, such as arrays of multi-wavelength lasers, waveguides, laser-waveguide microstructures and other optical components. The same technology can also be used for semiconductor laser facet treatment, which should lead to better performance devices.

The predominant application of devices fabricated with the use of this invention will likely be in local area networks (LAN), metropolitan area networks (MAN) where fast tuning of the transmitter is essential to the system performance. The number of wavelengths in those applications doesn't have to be as large as in dense WDM long haul systems, and thus the requirement for channel spacing can be also relaxed. Also, in wavelength routed networks those laser arrays will be advantageous, considering cost and wavelength selection feature.

The invention is particularly useful in the fabrication of optical components in a monolithically integrated geometry that would involve lasers, waveguides, beam splitters, optical switches and gratings required for processing of optical signals.

BRIEF DESCRIPTION OF THE DRAWINGS

The invention will now be described in more detail, by way of example, only with reference to the accompanying drawings, in which.

The process of band-gap shifting achieved with an UV laser-induced quantum well intermixing is schematically described in FIGS. 1A to 1E.

DETAILED DESCRIPTION OF THE PREFERRED EMBODIMENTS

Figure 1A:
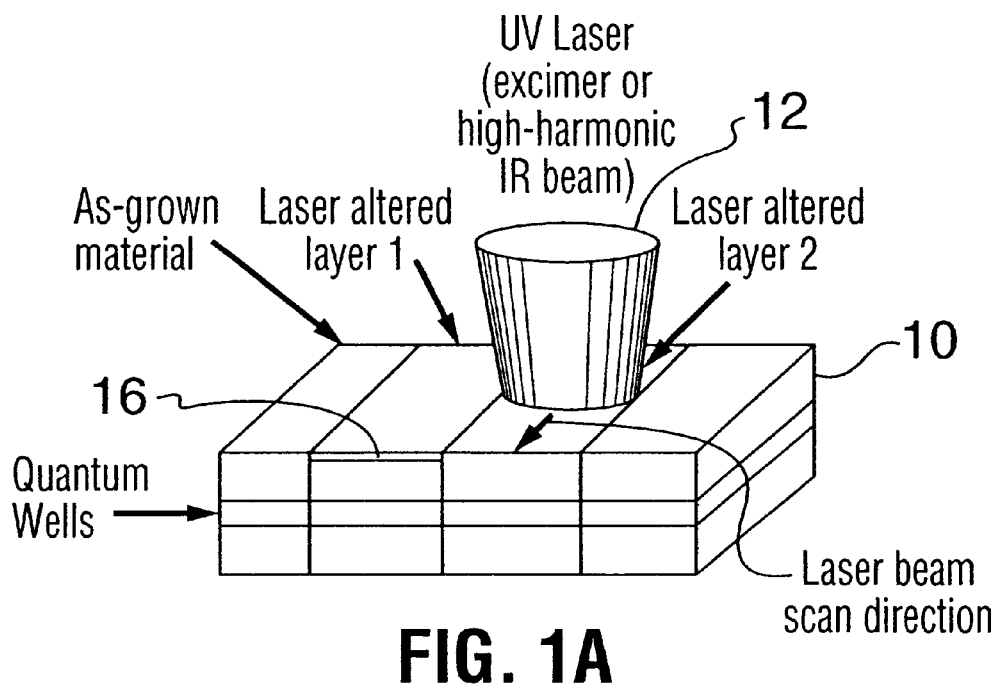
FIG. 1A illustrates the process of UV irradiation of a QW sample with an excimer laser (308, 248 or 193 nm) or a beam of a high-harmonic of IR laser, such as Nd:YAG operating at 355 nm or second harmonic Ar-ion laser (244 nm).

The present application discloses a novel method for inducing band-gap shifting as well as for fine band-gap tuning in III-V semiconductor material microstructures. The microstructures of primary interest are quantum-well-based active devices, such as lasers, detectors, amplifiers, modulators, etc. Other non-(III-V) material microstructures, which comprise quantum wells (QW), e.g., Si/SiGe or CdTe/InSb, are of interest as well. By way of example, and in accordance with the present invention, a QW material 10 to be tuned is first irradiated with an UV beam 12 and then subjected to thermal annealing in furnace 14 (FIG. 13). The irradiation can be realized with a pulsed laser, such as excimer or high-harmonic IR laser, or a continuous radiation from an UV lamp (e.g., an excimer lamp). The advantage in using an excimer laser is that it can process relatively large areas in one step, similarly to the area coverage achieved by the excimer-based photolithography technique. The purpose of the irradiation is to:

a) introduce defects at the sample surface or in the sub-surface region;

b) modify the surface of the sample in such a way that it can act either as a source or sink of defects that are activated during thermal annealing.

The important feature of this method is that the "defect reservoir" 16 created by the UV radiation is localized within a shallow depth from the surface, for example, 100 nm or less and typically 20 nm or less. Also, in addition to the ability to fabricate a defect-rich layer near the surface of the irradiated sample, the UV process can be used to induce chemical changes and/or the growth of a thin film on top of the processed sample. The composition of such film can be chosen to achieve the maximum intermixing effect. The selective irradiation of the sample is obtained either by scanning a focused laser beam, or by projecting suitable patterns using a mask technique (projection or contact). Following UV irradiation procedure, the sample is thermally annealed (FIGS. 1B, 1D or 1E) in order to realize a defect-mediated process of intermixing between atoms at the quantum well-barrier heterointerface. During this step, the intermixing of the well and barrier material takes place as a result of a defect-mediated diffusion. The important feature of this process is that the diffusion occurs at temperatures that are too low to induce any changes in areas that had not been exposed to the UV radiation. As a result of the intermixing the shape of the quantum well layers is modified, which results in a change of their ground state energy levels (band-gap structure). The extent of the intermixing and modification of the band-gap structure is controlled by both the composition of the UV-formed thin film and/or concentration of defects on top of the processed sample. The process of intermixing can be achieved is several steps consisting of UV irradiation and thermal annealing, which makes it possible to realize a fine band-gap tuning. Both the process of UV irradiation and thermal annealing can be carried out in the same chamber, without changing the position of the sample, until the required parameters of band-gap shifting have been achieved.

The sample discussed in FIG. 1 was grown by chemical beam epitaxy. It includes 5 quantum wells of InGaAs that are embedded between InGaAsP barrier layers. Other QW-based semiconductor laser materials that could be processed with this technique include: AlGaAs/GaAs, AlGaAs/InGaAs, AlGaInP/GaAs. In addition, Si/SiGe QW material could also be processed with this technique.

Figure 1B:
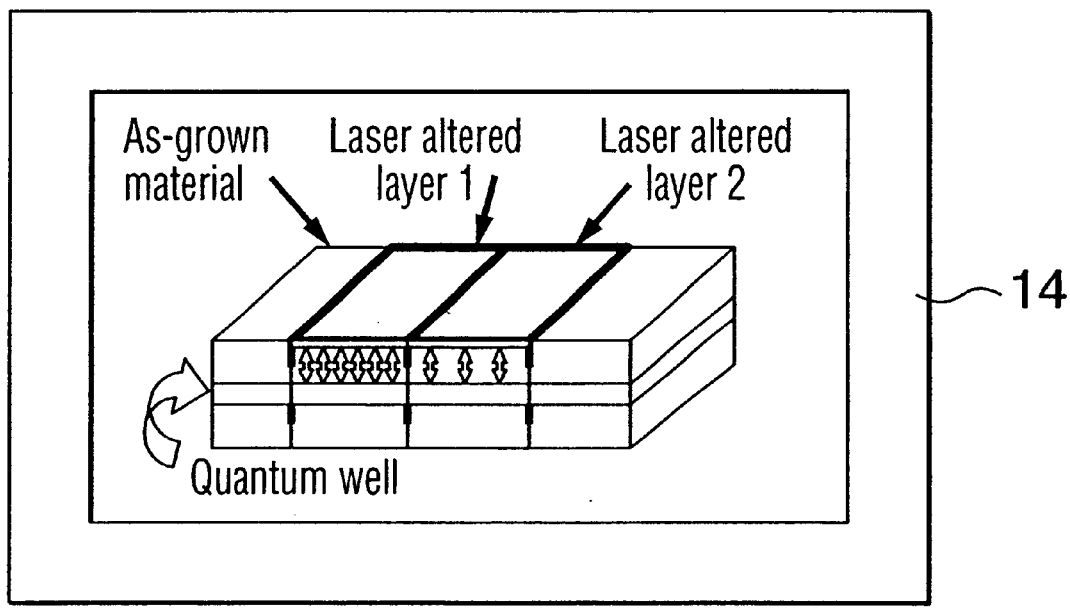
FIG. 1B describes the process of developing the UV-made pattern in a Rapid Thermal Annealing (RTA) furnace.
Figure 1C:
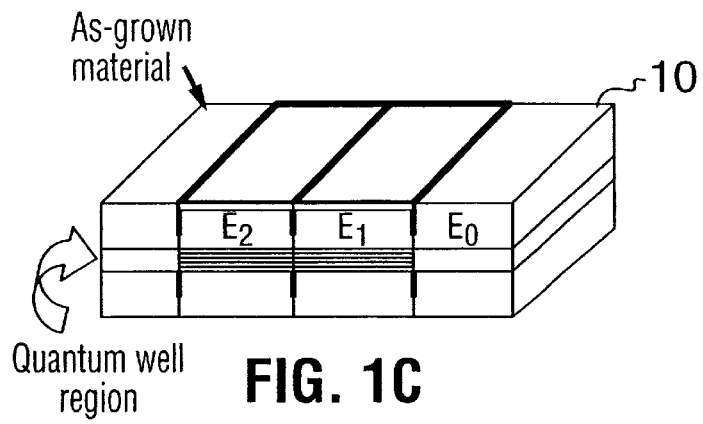
FIG. 1C indicates a new material that has been obtained following this 2-step process. Selectively processed areas of the material may have the band-gap shifted in excess of 100–200 nm.
Figure 1D:
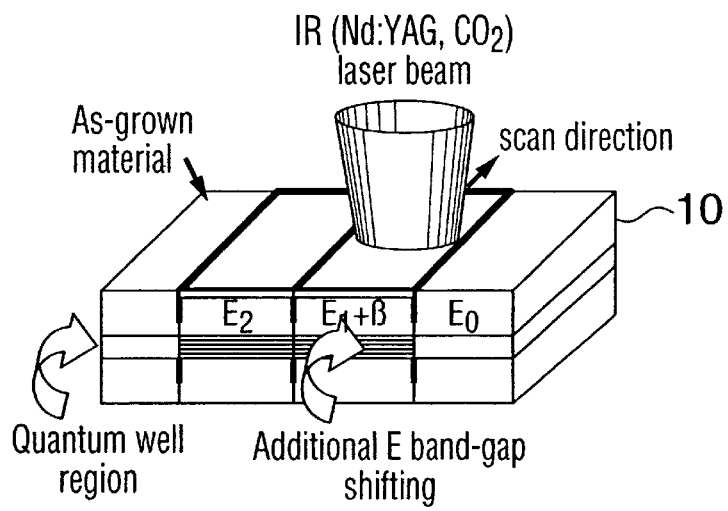
FIG. 1D describes the process of fine tuning in areas that the initial intermixing did not lead to the sufficient band-gap shifting.
Figure 1E:
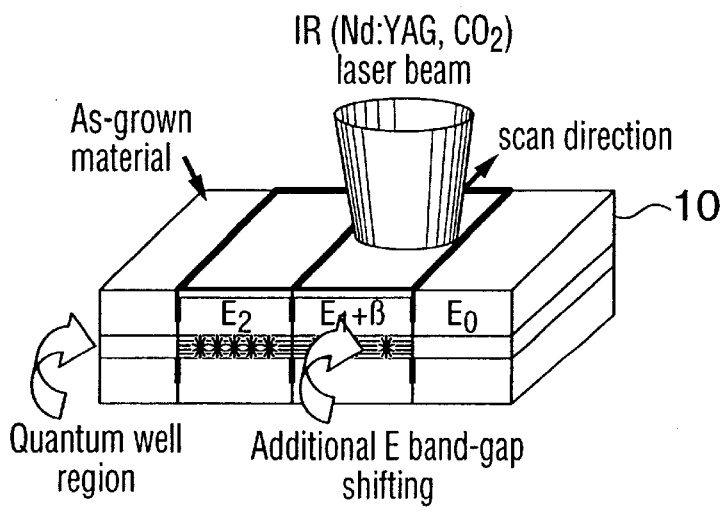
FIG. 1E schematically symbolizes the process of developing the UV-made pattern (As it is shown, it can be realized entirely with the use of an IR laser (Nd:YAG or $CO_2$) as a heating source).
Figure 2A:
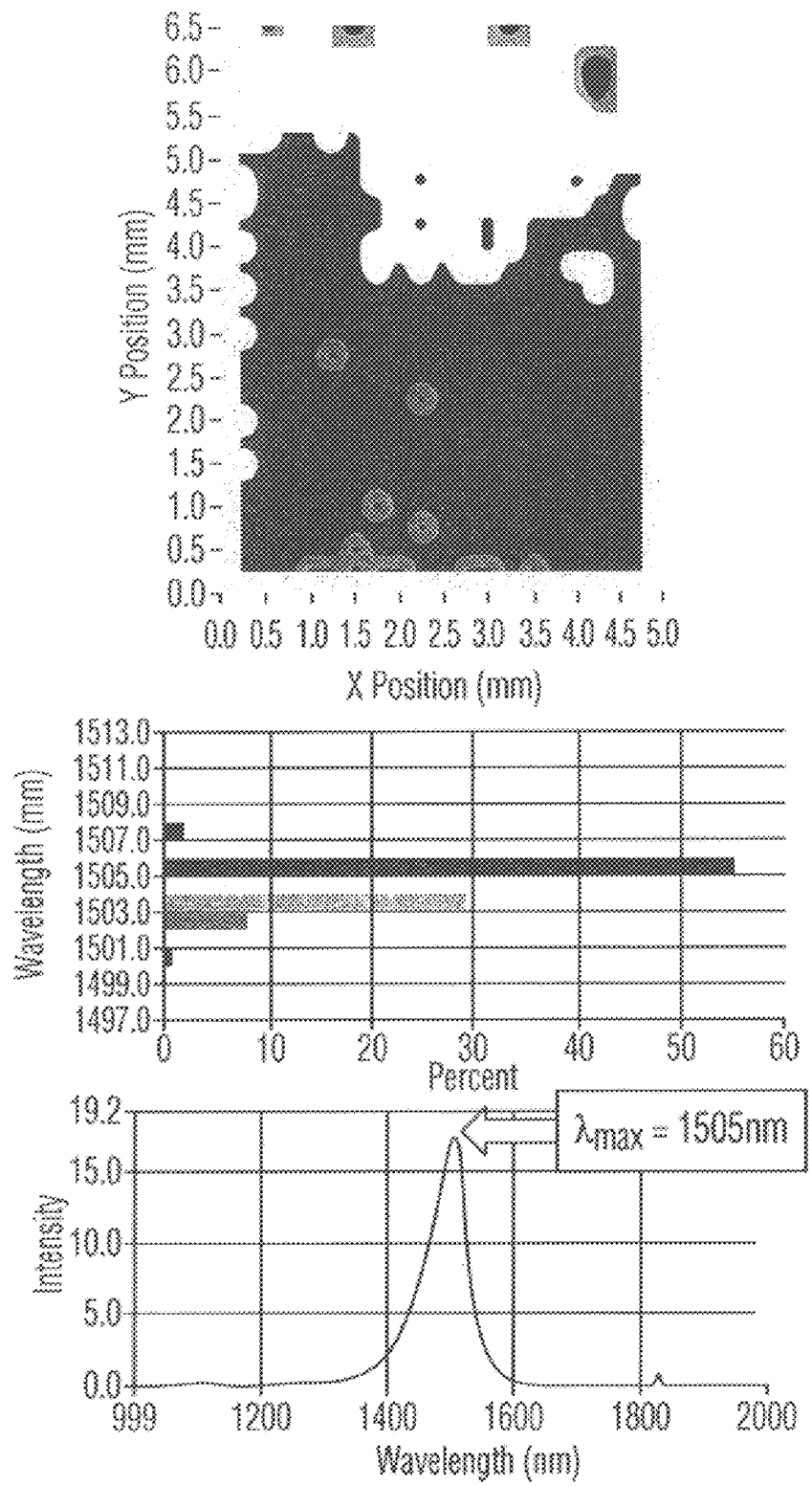
FIG. 2A graphically illustrates that no optical changes (wavelength shift) occur in the QW sample following the selective area irradiation with the UV radiation.
Figure 2B:
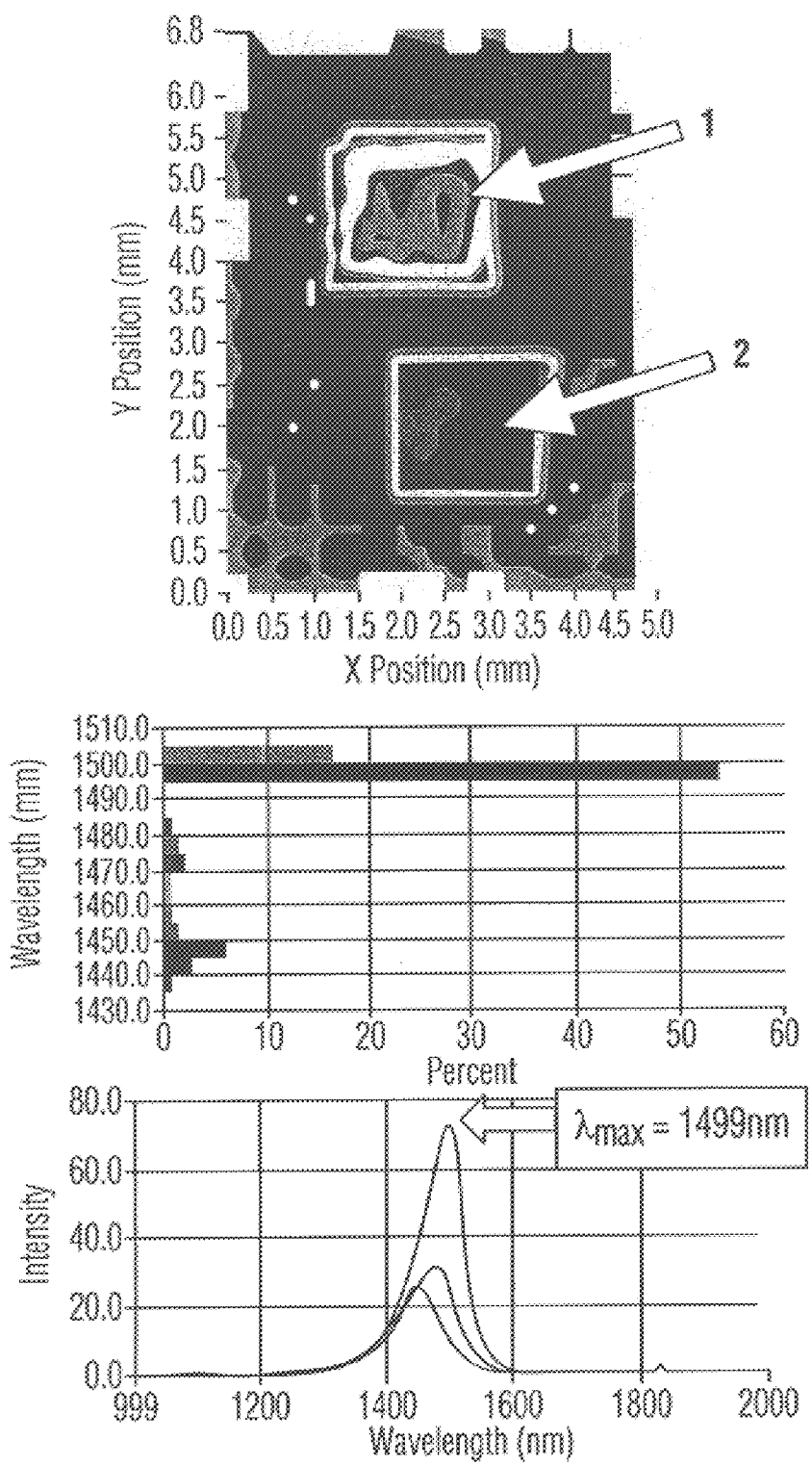
FIG. 2B graphically illustrates the evidence of formation two selective areas of bandgap shifted material following a short-time annealing of the sample that was first irradiated with the UV radiation.

UV irradiation was carried out with a KrF excimer laser ($\lambda$=248 nm) delivering 30 ns pulses. Pulse energy (fluence) at the sample surface was about 100 mJ/cm$^2$. The results shown in FIG. 2 concern the photoluminescence measured at room temperature from the UV irradiated sample (FIG. 2A) and from the same sample following 10 sec RTA at 750° C. Two sites, which can be seen in FIG. 2B, were irradiated with 500 and 1000 pulses (site 1 and 2, respectively). The irradiation was carried out using a laser mask projection technique, which offers a significant advantage over other techniques applied for selective area intermixing, such as ion implantation (the need of a mask being in physical contact with the sample) or oxide layer (the surface of the sample has to be patterned with the oxide). It can be seen that the UV irradiation alone does not introduce any changes detectable with the photoluminescence mapping (FIG. 2A). Most of the 5×6 mm sample is characterized by the quantum well signal at $\lambda$=1505 nm. The sample is affected only to a minor extent following a 10 sec annealing at 750° C., with the majority of the background quantum well signal located at $\lambda$=1499 nm (FIG. 2B). However, two blue-shifted areas, each approximately 2.0×1.5 mm, of the intermixed material can clearly be seen in this figure. The 500 (site 1) and 1000 (site 2) pulse areas are characterized by the quantum well signal at 1476 and 1449 nm, respectively. At this stage, the sample could be annealed for the second time in a RTA apparatus, as indicated in FIG. 1B, or selected areas could be annealed with an IR laser, as indicated in FIG. 1D. The use of an IR laser for fine tuning makes possible the realization of intermixing in selective areas without affecting each other. One skilled in the art may therefore increase the demand for a material with band-gap shifted regions that are far beyond limits possible with other technologies. An important aspect of the novel tuning method is that the whole process of band-gap tuning can be realized with the "laser only" approach. This is schematically illustrated by the step A–E in FIG. 1.

The novel approach exemplified above simplifies the whole procedure of band-gap tuning, allows for the application of a more efficient in-situ diagnostics, leading to a more efficient, precise and, potentially, less expensive process. The invention also allows the processing of industrial size semiconductor wafers 3 inch diameter and more.

It is to be understood that the above description is intended to be illustrative, and not restrictive. Many other embodiments will be apparent to those skilled in the art.

I claim:

1. A precursor quantum well microstructure for a tunable laser, comprising a quantum well layer between a pair of barrier layers, and a defect reservoir formed by ultraviolet radiation within a near-surface region and varying across a surface of the microstructure, said defect reservoir being capable of acting as a source or sink of defects during a subsequent thermal anneal to induce defect-mediated quantum-well intermixing at the quantum well-barrier layer heterointerface.

2. A precursor quantum well microstructure as claimed in claim 1, wherein said defect reservoir is formed across said surface in a predetermined pattern.

3. A precursor quantum well microstructure as claimed in claim 1, wherein said near-surface region is about 100 nm or less.

4. A precursor quantum well microstructure as claimed in claim 1, comprising quantum wells of InGaAs embedded between InGaAsP barrier layers.

5. A tunable laser including a precursor quantum well microstructure as claimed in claim 1 that has been subjected to a thermal anneal to induce defect-mediated quantum well intermixing.

* * * * *